(12) United States Patent
Jung et al.

(10) Patent No.: US 12,100,635 B2
(45) Date of Patent: Sep. 24, 2024

(54) SEMICONDUCTOR PACKAGE AND METHOD OF FABRICATING THE SAME

(71) Applicant: Samsung Electronics Co., Ltd., Suwon-si (KR)

(72) Inventors: Sanghoon Jung, Asan-si (KR); Young Lyong Kim, Anyang-si (KR); Cheolsoo Han, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 205 days.

(21) Appl. No.: 17/185,116

(22) Filed: Feb. 25, 2021

(65) Prior Publication Data
US 2022/0020656 A1    Jan. 20, 2022

(30) Foreign Application Priority Data

Jul. 15, 2020 (KR) .......................... 10-2020-0087560

(51) Int. Cl.
*H01L 23/31* (2006.01)
*H01L 21/56* (2006.01)
(Continued)

(52) U.S. Cl.
CPC ........ *H01L 23/3157* (2013.01); *H01L 21/563* (2013.01); *H01L 23/49833* (2013.01); *H01L 23/49838* (2013.01); *H01L 24/32* (2013.01); *H01L 24/83* (2013.01); *H01L 25/18* (2013.01); *H01L 23/481* (2013.01);
(Continued)

(58) Field of Classification Search
CPC .......................... H01L 23/3157; H01L 21/563
See application file for complete search history.

(56) References Cited

U.S. PATENT DOCUMENTS 8,895,359 B2    11/2014  Tomura et al.
9,899,305 B1 *   2/2018  Yeh ...................... H01L 23/5385
(Continued)

FOREIGN PATENT DOCUMENTS

JP    2003-100816 A    4/2003
JP    2008-112767 A    5/2008
(Continued)

OTHER PUBLICATIONS

Definition of "isolated", https://dictionary.cambridge.org/us/dictionary/english/ (2022) (Year: 2022).*
(Continued)

*Primary Examiner* — Michele Fan
(74) *Attorney, Agent, or Firm* — Harness, Dickey & Pierce, P.L.C.

(57) ABSTRACT

Disclosed is a semiconductor package comprising a lower substrate including a conductive line; a first semiconductor chip on the lower substrate; an under-fill layer between the first semiconductor chip and the lower substrate, the under-fill layer including a central part below the first semiconductor chip and an edge part isolated from direct contact with the central part in a first direction parallel to a top surface of the lower substrate, and a recess region between the central part and the edge part. The recess region may be defined by a sidewall of the central part, a sidewall of the edge part, and a top surface of the conductive line in the lower substrate.

20 Claims, 13 Drawing Sheets

(51) Int. Cl.
  *H01L 23/00* (2006.01)
  *H01L 23/498* (2006.01)
  *H01L 25/18* (2023.01)
  *H01L 23/48* (2006.01)

(52) U.S. Cl.
  CPC .. *H01L 23/49816* (2013.01); *H01L 23/49822* (2013.01); *H01L 24/92* (2013.01); *H01L 2224/32054* (2013.01); *H01L 2224/32057* (2013.01); *H01L 2224/32225* (2013.01); *H01L 2224/83939* (2013.01); *H01L 2224/92125* (2013.01)

(56) References Cited

U.S. PATENT DOCUMENTS

| | | | |
|---|---|---|---|
| 10,504,824 B1* | 12/2019 | Pan | H01L 24/09 |
| 10,510,672 B2 | 12/2019 | Kim et al. | |
| 10,553,457 B2 | 2/2020 | Isobe | |
| 2007/0045867 A1* | 3/2007 | Machida | H05K 1/186 |
| | | | 257/E23.125 |
| 2012/0061853 A1 | 3/2012 | Su et al. | |
| 2013/0137216 A1* | 5/2013 | Ito | H01L 25/0652 |
| | | | 438/109 |
| 2015/0001733 A1* | 1/2015 | Karhade | H01L 23/49894 |
| | | | 257/782 |
| 2017/0047266 A1* | 2/2017 | Ihara | H01L 21/4882 |
| 2020/0126887 A1* | 4/2020 | Lin | H01L 23/42 |

FOREIGN PATENT DOCUMENTS

| | | | |
|---|---|---|---|
| JP | 5375563 | B2 | 12/2013 |
| KR | 10-1571837 | B1 | 11/2015 |

OTHER PUBLICATIONS

Definition of "isolated", http://www.dictionary.com (2022) (Year: 2022).*

* cited by examiner

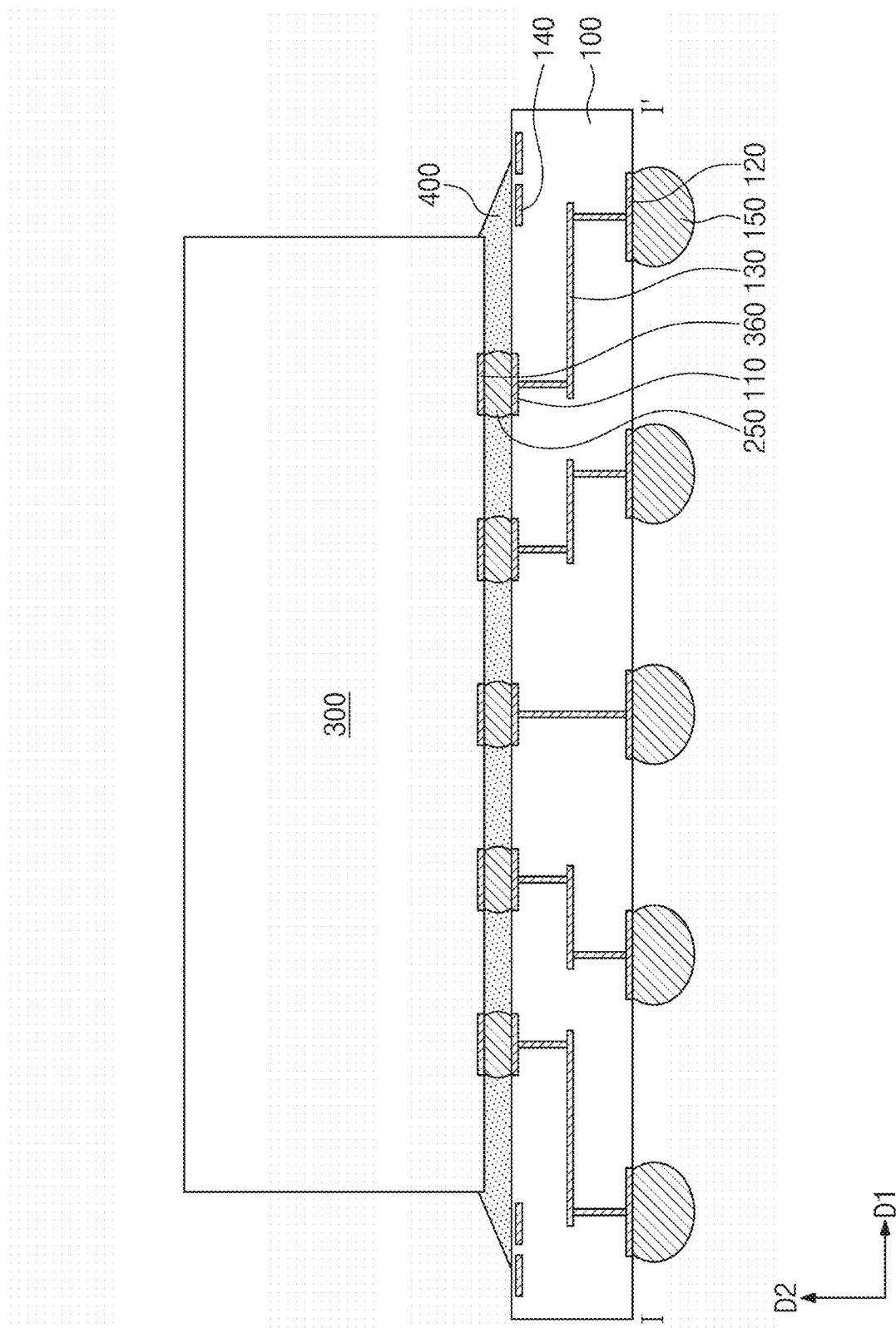

SEMICONDUCTOR PACKAGE AND METHOD OF FABRICATING THE SAME

CROSS-REFERENCE TO RELATED APPLICATION

This U.S. nonprovisional application claims priority under 35 U.S.C § 119 to Korean Patent Application No. 10-2020-0087560 filed on Jul. 15, 2020 in the Korean Intellectual Property Office, the disclosure of which is hereby incorporated by reference in its entirety.

BACKGROUND

The present inventive concepts relate to a semiconductor package, and more particularly, to a semiconductor package including an under-fill layer and a method of fabricating the same.

A semiconductor package may be included on an integrated circuit chip for use in electronic products. Typically, a semiconductor package is configured such that a semiconductor chip is mounted on a printed circuit board (PCB) and bonding wires and/or bumps are used to electrically connect the semiconductor chip to the printed circuit board. With the recent development of electronic industry, the semiconductor package is variously developed to reach the goal of compact size, small weight, and/or low manufacturing cost. In addition, many kinds of semiconductor packages show up with the expansion of their application field such as high-capacity mass storage devices.

SUMMARY

Some example embodiments of the present inventive concepts provide a semiconductor package with increased reliability.

According to some example embodiments of the present inventive concepts, a semiconductor package may comprise: a lower substrate including a conductive line; a first semiconductor chip on the lower substrate; an under-fill layer between the first semiconductor chip and the lower substrate, the under-fill layer including a central part below the first semiconductor chip, and an edge part isolated from direct contact with the central part in a first direction parallel to a top surface of the lower substrate; and a recess region between the central part and the edge part, the recess region may be defined by a sidewall of the central part, a sidewall of the edge part, and a top surface of the conductive line.

According to some example embodiments of the present inventive concepts, a semiconductor package may comprise: a lower substrate including a conductive line; a first semiconductor chip on the lower substrate; an under-fill layer between the first semiconductor chip and the lower substrate, the under-fill layer including a central part below the first semiconductor chip, and an edge part isolated from direct contact with the central part in a first direction parallel to a top surface of the lower substrate; and a recess region between the central part and the edge part. A bottom surface of the recess region may be lower than the top surface of the lower substrate.

According to some example embodiments of the present inventive concepts, a semiconductor package may comprise: a lower substrate including a conductive line; an interposer substrate on the lower substrate and electrically connected to the lower substrate through a plurality of bumps; a first semiconductor chip on the interposer substrate; a plurality of chip stacks on the interposer substrate isolated from direct contact with each other in a first direction parallel to a top surface of the lower substrate, the first semiconductor chip between the plurality of chip stacks; an under-fill layer between the lower substrate and the interposer substrate, the under-fill layer including a central part below the interposer substrate, and an edge part isolated from direct contact, in the first direction, with the central part; and a recess region between the central part and the edge part. The recess region may be defined by a sidewall of the central part, a sidewall of the edge part, and a top surface of the conductive line in the lower substrate.

BRIEF DESCRIPTION OF THE DRAWINGS

FIGS. 12 and 14 illustrate cross-sectional views showing a method of fabricating a semiconductor package according to some example embodiments of the present inventive concepts.

DETAILED DESCRIPTION OF EMBODIMENTS

Some example embodiments of the present inventive concepts will now be described in detail with reference to the accompanying drawings to aid in clearly explaining the present inventive concepts.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

Spatially relative terms, such as "below," "lower," "under," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly.

When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
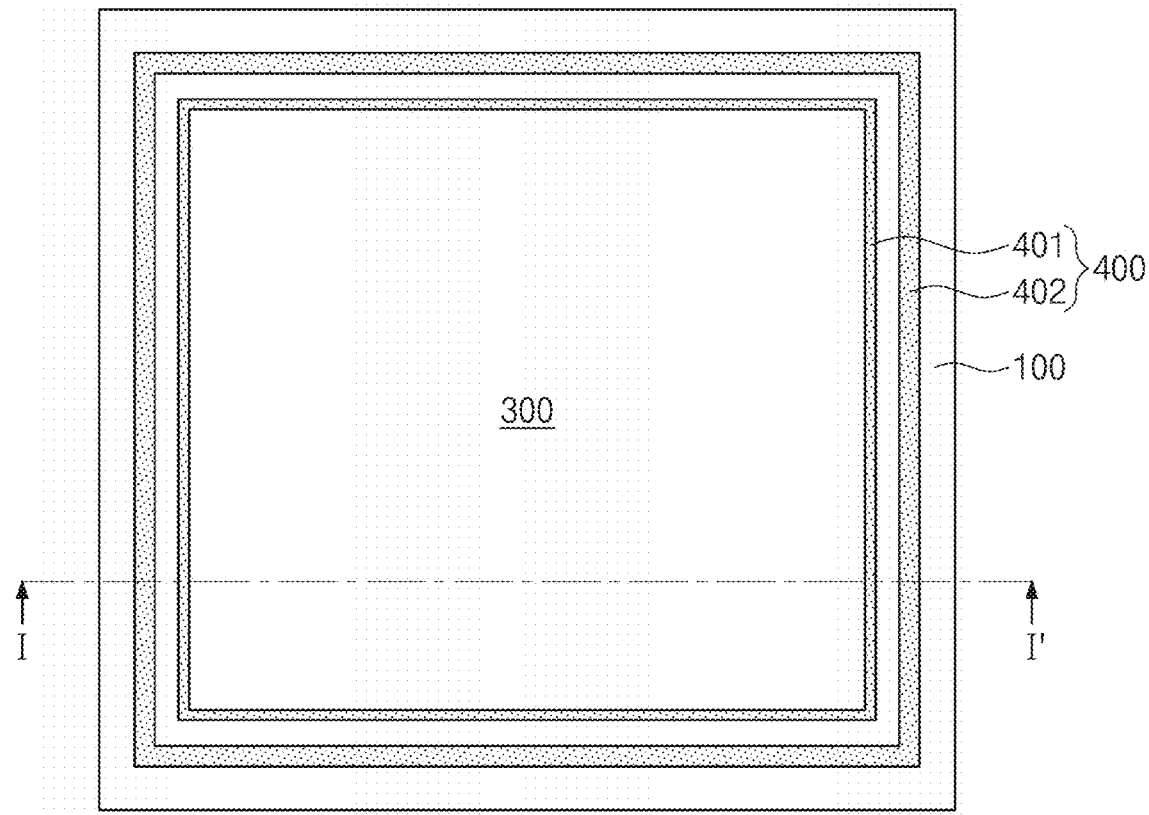
FIG. 1 illustrates a plan view showing a semiconductor package according to some example embodiments of the present inventive concepts.
Figure 2:
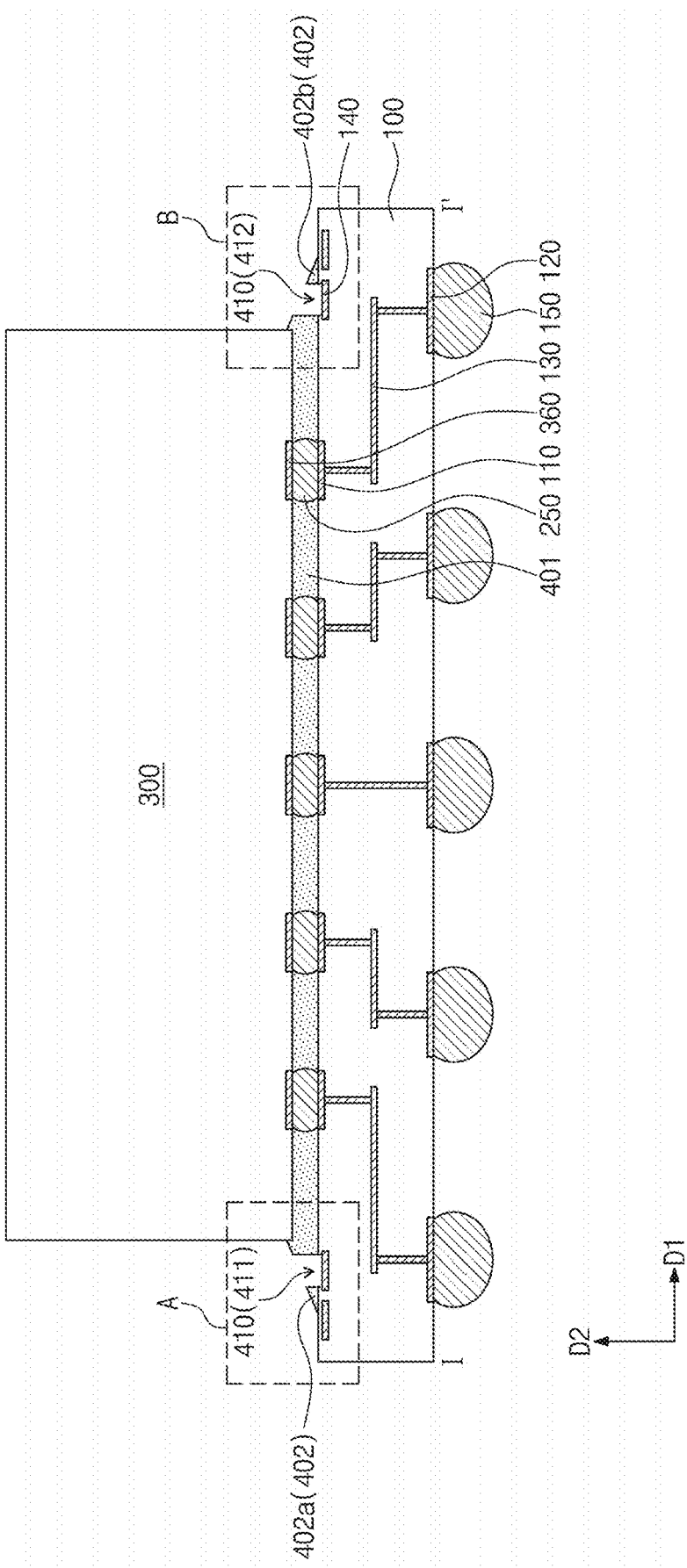
FIG. 2 illustrates a cross-sectional view taken along line I-I' of FIG. 1.
Figure 3:
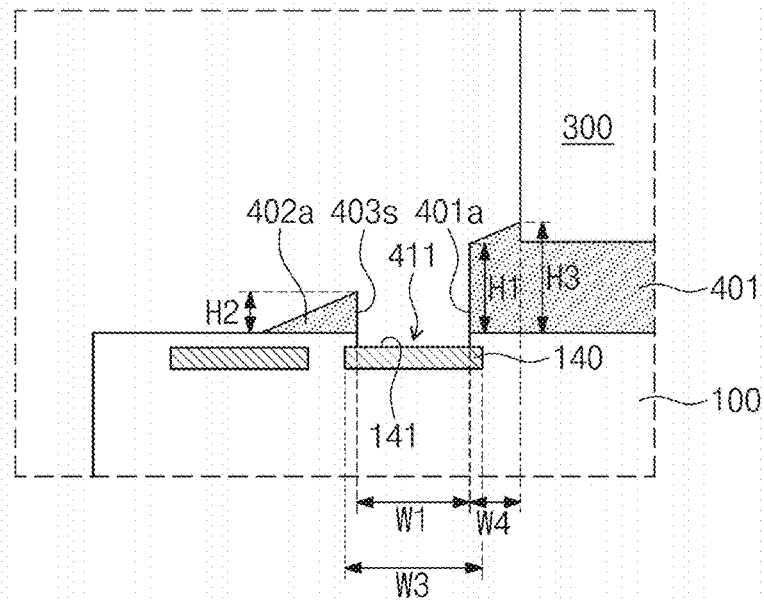
FIG. 3 illustrates an enlarged view showing section A of FIG. 2.
Figure 4:
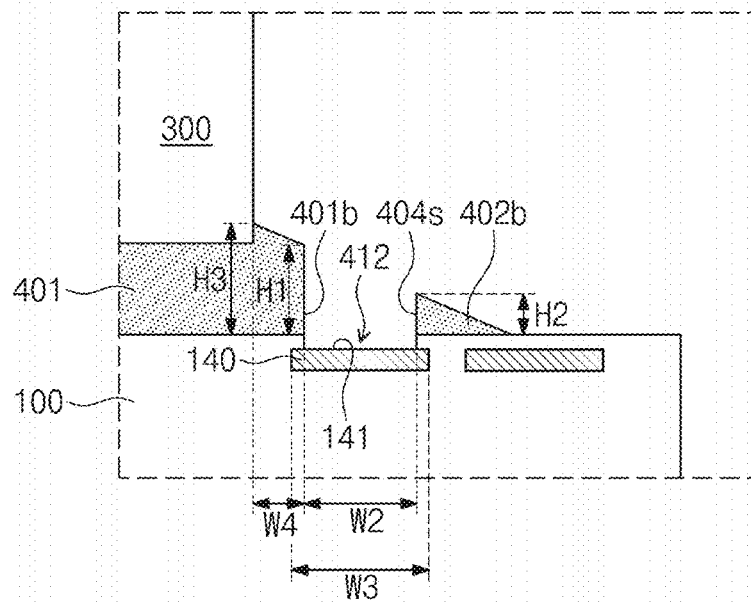
FIG. 4 illustrates an enlarged view showing section B of FIG. 2.

FIG. 1 illustrates a plan view showing a semiconductor package according to some example embodiments of the present inventive concepts. FIG. 2 illustrates a cross-sectional view taken along line I-I' of FIG. 1. FIG. 3 illustrates an enlarged view showing section A of FIG. 2. FIG. 4 illustrates an enlarged view showing section B of FIG. 2.

Referring to FIGS. 1, 2, 3, and 4, a semiconductor package may include a lower substrate 100, a semiconductor chip 300 disposed on the lower substrate 100, and an under-fill layer 400 interposed between the lower substrate 100 and the semiconductor chip 300.

The lower substrate 100 may be a printed circuit board (PCB). The lower substrate 100 may include first lower substrate pads 110, second lower substrate pads 120, lower substrate lines 130, and a conductive line 140. The first lower substrate pads 110 may be adjacent to a top surface of the lower substrate 100, and the second lower substrate pads 120 may be adjacent to a bottom surface of the lower substrate 100. The first lower substrate pads 110 may be exposed on the top surface of the lower substrate 100. The lower substrate lines 130 and the conductive line 140 may be disposed in the lower substrate 100, and may be electrically connected to the first lower substrate pads 110 and the second lower substrate pads 120. Herein, the phrase "two components are electrically connected/coupled to each other" may include, for example, "two components are directly connected/coupled to each other" and/or "two components indirectly connected/coupled to each other through a different conductive component." The first lower substrate pads 110 and/or the second lower substrate pads 120 may include a conductive material, for example, at least one metal selected from tin (Sn), lead (Pb), nickel (Ni), gold (Au), silver (Ag), copper (Cu), aluminum (Al), and/or bismuth (Bi). The lower substrate lines 130 and/or the conductive line 140 may include a conductive material, for example, at least one metal selected from copper (Cu), aluminum (Al), tungsten (W), and/or titanium (Ti).

External terminals 150 may be provided on the bottom surface of the lower substrate 100. For example, the external terminals 150 may be disposed on bottom surfaces of the second lower substrate pads 120. The external terminals 150 may be electrically connected to the lower substrate lines 130. The external terminals 150 may be coupled to an external device. Therefore, external electrical signals may be transmitted to and from the first lower substrate pads 110 through the external terminals 150. The external terminals 150 may include, for example, solder balls, and/or solder bumps. The external terminals 150 may include a conductive material, for example, at least one metal selected from tin (Sn), lead (Pb), nickel (Ni), gold (Au), silver (Ag), copper (Cu), aluminum (Al), and/or bismuth (Bi). For example, the external terminal 150 may include a eutectic alloy including a conductive material.

The semiconductor chip 300 may be mounted on the lower substrate 100. The semiconductor chip 300 may include, for example, a logic chip, a buffer chip, a system-on-chip (SOC), and/or a memory chip. For example, the memory chip may be a dynamic random access memory (DRAM) chip. The semiconductor chip 300 may include chip pads 360 adjacent to a bottom surface of the semiconductor chip 300. The chip pads 360 may be electrically connected to corresponding ones of the first lower substrate pads 110. The chip pads 360 may include a conductive material, for example, at least one metal selected from tin (Sn), lead (Pb), nickel (Ni), gold (Au), silver (Ag), copper (Cu), aluminum (Al), and/or bismuth (Bi).

Substrate bumps 250 may be interposed between the lower substrate 100 and the semiconductor chip 300. The lower substrate 100 may be electrically connected through the substrate bumps 250 to the semiconductor chip 300. Each of the chip pads 360 may be electrically connected through a corresponding one of the substrate bumps 250 to a corresponding one of the first lower substrate pads 110. The substrate bumps 250 may include a conductive material and/or include at least one selected from a solder ball shape, a bump shape, and/or a pillar shape.

The under-fill layer 400 may be disposed between the lower substrate 100 and the semiconductor chip 300. The under-fill layer 400 may include a dielectric polymer material, such as an epoxy resin. The under-fill layer 400 may include a central part 401, an edge part 402, and a recess region 410. The central part 401 may be disposed below the semiconductor chip 300, and may fill a space between the substrate bumps 250. For example, the central part 401 may fill a space between the lower substrate 100 and the semiconductor chip 300. The central part 401 may protrude beyond opposite sidewalls of the semiconductor chip 300. The edge part 402 may be spaced apart from the central part 401 in a first direction D1, wherein the first direction D1 is a direction parallel to the top surface of the lower substrate 100. The edge part 402 may include a first edge part 402a and a second edge part 402b, for example, when viewed in cross-section. The first edge part 402a and the second edge part 402b may be spaced apart in the first direction D1 from each other across the central part 401.

When viewed in plan, the central part 401 may have a quadrangle structure whose corners are non-rounded or rounded. When viewed in plan, the edge part 402 may have a ring structure. For example, the edge part 402 may have a quadrangle ring structure whose corners are non-rounded or rounded. When viewed in plan, the edge part 402 may encircle the central part 401. When viewed in plan, the central part 401 and the edge part 402 may be spaced apart from each other. Though illustrated as a continuous ring structure, the edge part 402 may include, for example, variations in the width of the ring and/or regions wherein the edge part 402 has been mostly and/or completely removed during the laser etching. In this case a residual and/or by-product of the laser etching of the under-fill layer 400 may remain, and may be included in and/or as the edge part 402.

The central part 401 may include a first sidewall 401*a* adjacent to the first edge part 402*a* and a second sidewall 401*b* adjacent to the second edge part 402*b*. For example, the first sidewall 401*a* may face a third sidewall 403*s* of the first edge part 402*a*, and the second sidewall 401*b* may face a fourth sidewall 404*s* of the second edge part 402*b*. A width in the first direction D1 between the first sidewall 401*a* and the second sidewall 401*b* may be greater than a width in the first direction D1 between the opposite sidewalls of the semiconductor chip 300. For example, the central part 401 may protrude past a sidewall of the semiconductor chip 300 by a width W4 in the first direction D1. In some example embodiments, about 120 µm to about 500 µm may be given as a minimum width W4 in the first direction D1 between the first sidewall 401*a* and one sidewall of the semiconductor chip 300 and/or about 120 µm to about 500 µm may be given as a minimum width W4 in the first direction D1 between the second sidewall 401*b* and one sidewall of the semiconductor chip 300. The first sidewall 401*a* and the second sidewall 401*b* may each have a height H1 in a second direction D2 perpendicular to the top surface of the lower substrate 100, and the height H1 may be greater than a height H2 in the second direction D2 of at least one sidewall of the edge part 402. For example, the height H1 in the second direction D2 of each of the first and second sidewalls 401*a* and 401*b* may be greater than a height H2 in the second direction D2 of the third sidewall 403*s* of the first edge part 402*a* and/or a height H2 in the second direction D2 of the fourth sidewall 404*s* of the second edge part 402*b*. The height H1 in the second direction D2 of each of the first and second sidewalls 401*a* and 401*b* may be about 60% to about 88% of a maximum height H3 in the second direction D2 of the central part 401.

The recess region 410 may be disposed adjacent to at least one side of the semiconductor chip 300. The recess region 410 may be defined by one sidewall of the central part 401, one sidewall of the edge part 402, and a top surface 141 of a portion of the conductive line 140 in the lower substrate 100. For example, the recess region 410 may include a first recess region 411 and a second recess region 412. The first recess region 411 may expose the first sidewall 401*a* of the central part 401 and the third sidewall 403*s* of the first edge part 402*a*. The second recess region 412 may expose the second sidewall 401*b* of the central part 401 and the fourth sidewall 404*s* of the second edge part 402*b*. Each of the first and second recess regions 411 and 412 may partially expose a corresponding top surface 141 of the conductive line 140. The exposed top surface 141 of the conductive line 140 may be located at a lower level than that of the top surface of the lower substrate 100. For example, the first recess region 411 and the second recess region 412 may each have a bottom surface at a lower level than that of the top surface of the lower substrate 100. Though not illustrated, according to some example embodiments of the present inventive concepts, the recess region 410 may partially expose top surfaces of some of the first lower substrate pads 110.

The first recess region 411 may have a width W1 and/or W2 which is narrower than a width W3 of a corresponding conductive line 140. For example, a width W1 in the first direction D1 of the first recess region 411 may be less than a width W3 in the first direction D1 of the conductive line 140 and/or a width W2 in the first direction D1 of the second recess region 412 may be less than the width W3 in the first direction D1 of the conductive line 140. The width W1 in the first direction D1 of the first recess region 411 may range from about 10 µm to about 500 µm and/or from about 100 µm to about 500 µm. The width W2 in the first direction D1 of the second recess region 412 may range from about 10 µm to about 500 µm and/or from about 100 µm to about 500 µm.

In general, when a subsequent annealing process is performed, there may occur a problem wherein the under-fill layer 400 is cracked due to stress generated by a difference in coefficient of thermal expansion (CTE) between the lower substrate 100 and the semiconductor chip 300. For example, a bending stress may be inversely proportional to an average cross-sectional area of a region where the stress is generated. According to the present inventive concepts, a laser etching process may form the recess region 410 of the under-fill layer 400, which may result reduce the bending stress transferred to the under-fill layer 400 due, in part, to an increase in the average cross-sectional area of the region where stress is generated. Accordingly, the occurrence of crack on the under-fill layer 400 may be decreased to provide the semiconductor package with increased reliability.

Figure 5:
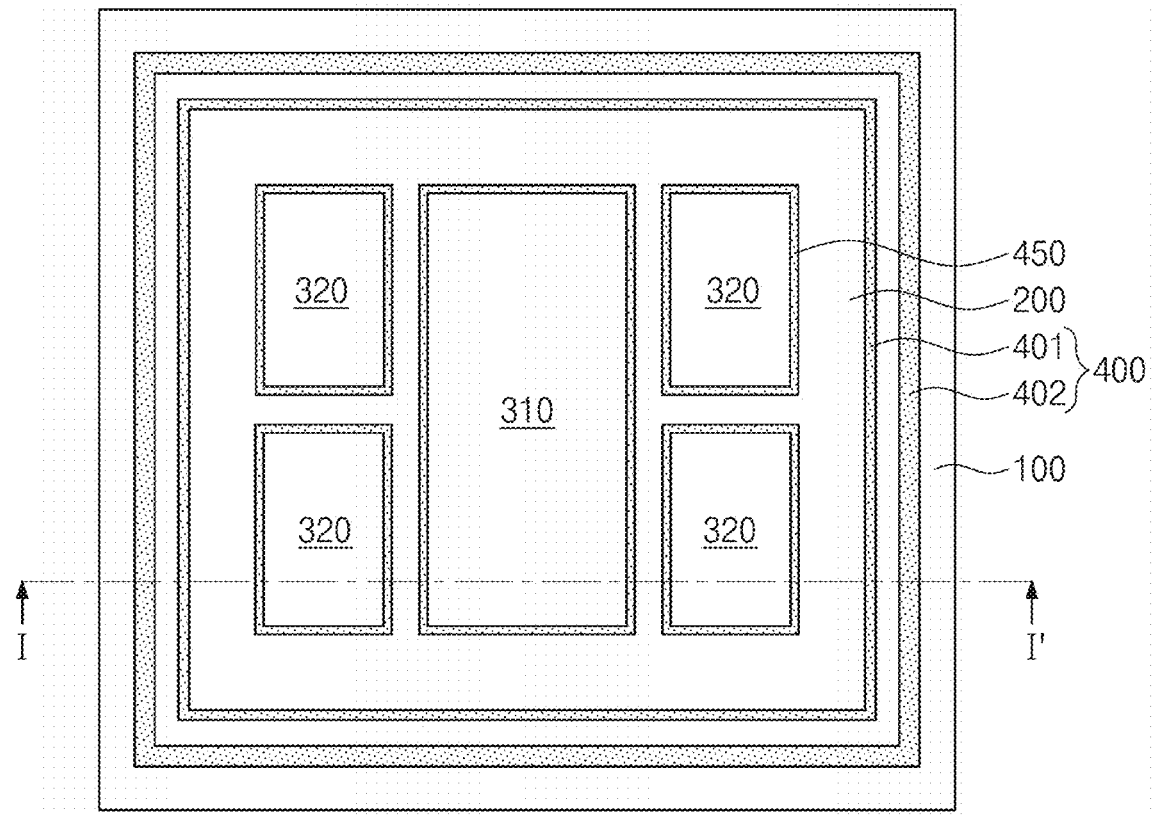
FIG. 5 illustrates a plan view showing a semiconductor package according to some example embodiments of the present inventive concepts.
Figure 6:
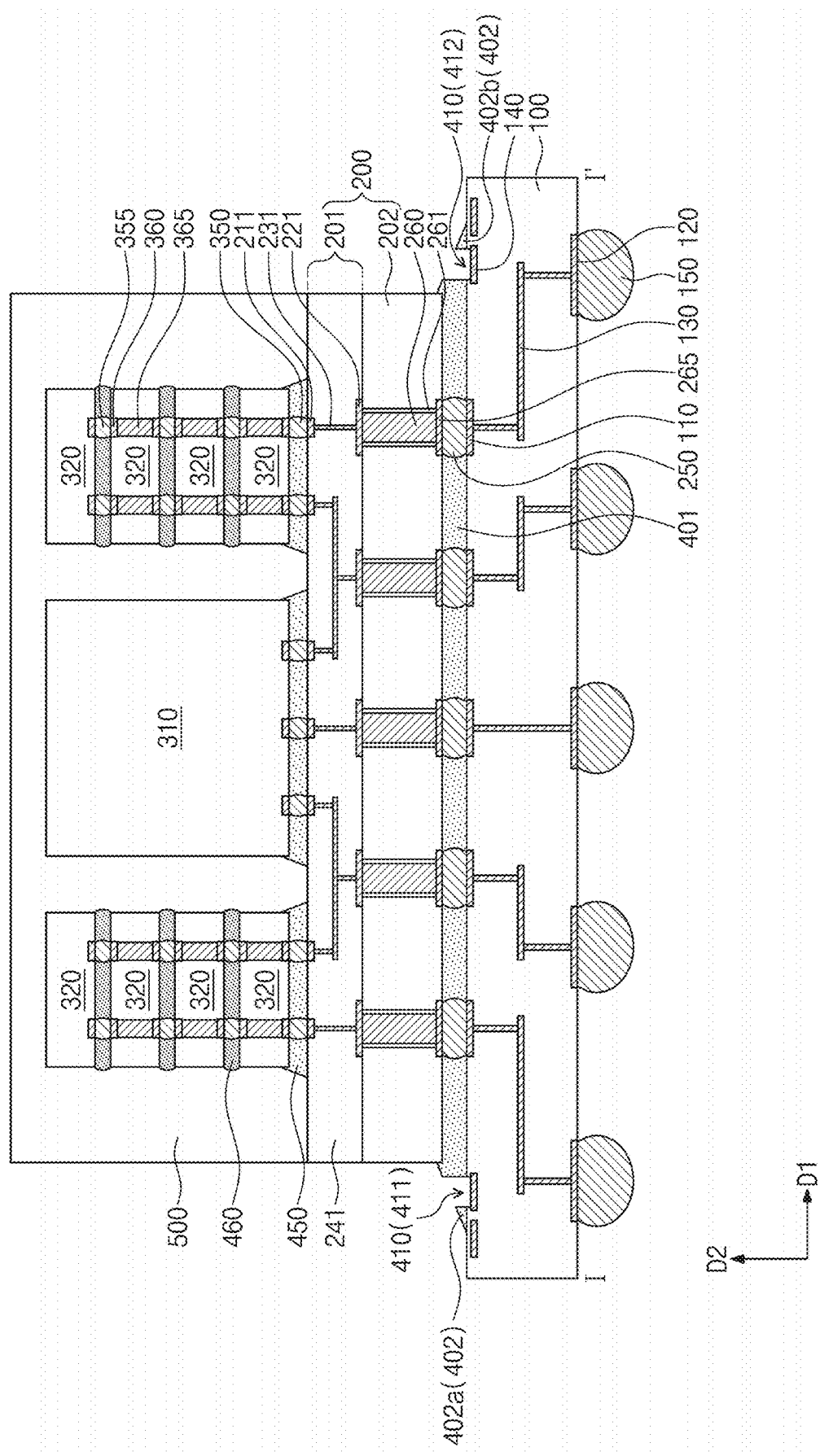
FIG. 6 illustrates a cross-sectional view taken along line I-I' of FIG. 5.

FIG. 5 illustrates a plan view showing a semiconductor package according to some example embodiments of the present inventive concepts. FIG. 6 illustrates a cross-sectional view taken along line I-I' of FIG. 5. Duplicate description wills be omitted below. For example, the description of the central part 401, the edge part 402, and the recess region 410 included in the under-fill layer 400 may be substantially the same as that discussed with reference to FIGS. 3 and 4.

Referring to FIGS. 5 and 6 together with FIGS. 3 and 4, the semiconductor package may further include an upper substrate 200, a first semiconductor chip 310 on the upper substrate 200, and a plurality of second semiconductor chips 320 on the upper substrate 200.

The upper substrate 200 may be disposed on the lower substrate 100. The upper substrate 200 may include a substrate layer 202 and a wiring layer 201 on the substrate layer 202. The wiring layer 201 and the substrate layer 202 may be collectively called an interposer substrate. For example, the substrate layer 202 may be a silicon (Si) substrate.

The wiring layer 201 may include upper conductive pads 211, lower conductive lines 221, and internal conductive lines 231. The wiring layer 201 may include a dielectric layer 241 that surrounds the upper conductive pads 211, the lower conductive lines 221, and the internal conductive lines 231. The upper conductive pads 211 may be adjacent to a top surface of the wiring layer 201, and the lower conductive lines 221 may be adjacent to a bottom surface of the wiring layer 201. The upper conductive pads 211 may be exposed at the top surface of the wiring layer 201. The lower conductive lines 221 may be exposed at the bottom surface of the wiring layer 201. The internal conductive lines 231 may be disposed in the wiring layer 201, and may be electrically connected to the upper conductive pads 211 and the lower conductive lines 221. The upper conductive pads 211 and the lower conductive lines 221 may include a conductive material, for example, at least one metal selected from tin (Si), lead (Pb), nickel (Ni), gold (Au), silver (Ag), copper (Cu), aluminum (Al), and/or bismuth (Bi). The internal conductive lines 231 may include a conductive material, for example, at least one metal selected from copper (Cu), aluminum (Al), tungsten (W), and/or titanium (Ti).

A plurality of through electrodes 260 may be disposed in the substrate layer 202, and may be electrically connected to the lower conductive lines 221. Each of the plurality of through electrodes 260 may penetrate the substrate layer 202, and may have electrical connection with a corresponding one of the lower conductive lines 221 and/or a corresponding one of the first lower substrate pads 110. The plurality of through electrodes 260 may include a conductive material (e.g., copper (Cu), aluminum (Al), tungsten (W), and/or titanium (Ti)). A dielectric liner 261 may be interposed between the substrate layer 202 and each of the plurality of through electrodes 260. The dielectric liner 261 may include a dielectric material. Lower conductive pads 265 may be disposed adjacent to a bottom surface of the substrate layer 202, and may be electrically connected to the through electrodes 260. The lower conductive pads 265 may include a conductive material (e.g., copper (Cu), aluminum (Al), tungsten (W), and/or titanium (Ti)).

The lower substrate 100 may be electrically connected through the substrate bumps 250 to the upper substrate 200. Each of the upper conductive pads 211 may be electrically connected through a corresponding one of the substrate bumps 250 to a corresponding one of the first lower substrate pads 110. A pitch of the substrate bumps 250 may be less than a pitch of the external terminals 150.

The first semiconductor chip 310 may be mounted on the upper substrate 200. The first semiconductor chip 310 may include a logic chip, a buffer chip, or a system-on-chip (SOC). For example, the first semiconductor chip 310 may include an application specific integrated circuit (ASIC) chip, an application processor (AP) chip, a central processing unit (CPU) and/or a graphic processing unit (GPU). The ASIC chip may include an application specific integrated circuit (ASIC).

The plurality of second semiconductor chips 320 may be mounted on the upper substrate 200. For example, the second semiconductor chips 320 may be stacked on the upper substrate 200. The plurality of second semiconductor chips 320 may form a plurality of chip stacks. The second semiconductor chips 320 may be spaced apart in a direction D1 parallel to the lower substrate 100 and/or from the first semiconductor chip 310. For example, the plurality of chip stacks maybe isolated from direct contact, in the direction D1, with each other and/or with the first semiconductor chip 310. The plurality of chip stacks and the first semiconductor chip 310 may be electrically connected through the wiring layer 201. The plurality of second semiconductor chips 320 may be of a different type from the first semiconductor chip 310. The plurality of second semiconductor chips 320 may be, for example, memory chips. The memory chips may include high bandwidth memory (HBM) chips. For example, the second semiconductor chips 320 may include dynamic random memory (DRAM) chips.

Some and/or all of the second semiconductor chips 320 may include an integrated circuit (not shown) and/or through vias 365. The integrated circuits may be provided in the second semiconductor chips 320. The through vias 365 may penetrate a corresponding one of the second semiconductor chips 320 and may have electrical connection with the integrated circuits. For example, an uppermost one of the second semiconductor chips 320 may not include the through vias 365.

Upper bumps 355 may be interposed between two neighboring second semiconductor chips 320. The upper bumps 355 may be electrically connected to the corresponding through vias 365 of the neighboring second semiconductor chips 320. The second semiconductor chips 320 may be electrically connected through the upper bumps 355 to the upper substrate 200 and other second semiconductor chips 320. The upper bumps 355 may include a conductive material, for example, at least one metal selected from tin (Sn), lead (Pb), nickel (Ni), gold (Au), silver (Ag), copper (Cu), aluminum (Al), and/or bismuth (Bi). For example, the upper bumps 355 may include a eutectic alloy including a conductive material.

A first chip under-fill layer 460 may be interposed between two neighboring second semiconductor chips 320, and may fill a space between the upper bumps 355. For example, the first chip under-fill layer 460 may include a non-conductive film (NCF), for example, a thermoset molding film such as an Ajinomoto build-up film (ABF).

The first semiconductor chip 310 may include chip pads 360 adjacent to a bottom surface of the first semiconductor chip 310. Some and/or all of the second semiconductor chips 320 may include chip pads 360 adjacent to top and bottom surfaces of the second semiconductor chips 320. For example, the chip pads 360 may not be included on a top surface of the uppermost one of the second semiconductor chips 320. The chip pads 360 may be electrically connected to corresponding ones of the first upper substrate pads 210.

Chip bumps 350 may be interposed between the upper substrate 200 and the first semiconductor chip 310 and/or between the upper substrate 200 and a lowermost one of the second semiconductor chips 320. The upper substrate 200 may be electrically connected through the chip bumps 350 to the first semiconductor chip 310 and the lowermost one of the second semiconductor chips 320. Each of the chip pads 360 may be electrically connected through a corresponding one of the substrate bumps 250 to a corresponding one of the first upper substrate pads 210. The chip bumps 350 may include a conductive material and may have at least one selected from a solder ball shape, a bump shape, and a pillar shape. A pitch of the chip bumps 350 may be less than a pitch of the substrate bumps 250. For example, the pitch of the chip bumps 350 electrically connecting the first semiconductor chip 310 to the upper substrate 200 and/or the pitch of the chip bumps 350 electrically connecting the second semiconductor chips 320 to the upper substrate 200 may each be less than the pitch of the substrate bumps 250.

A chip under-fill layer 450 may be interposed between the upper substrate 200 and the first semiconductor chip 310 and/or between the upper substrate 200 and the lowermost one of the second semiconductor chips 320, and may fill a space between the chip bumps 350. For example, a portion of the top surface of the upper substrate, between the stacked second semiconductor chips 320 and the first semiconductor chip may be exposed by a gap in the chip under-fill layer 450. The chip under-fill layer 450 may include a dielectric polymer material, such as an epoxy-based resin and/or molding compound.

A molding layer 500 may be provided on the upper substrate 200, covering the first semiconductor chip 310 and the second semiconductor chips 320. The molding layer 500 may include, for example, a dielectric polymer, such as an epoxy-based resin and/or molding compound.

An under-fill layer 400 may be interposed between the lower substrate 100 and the upper substrate 200. For example, a bottom surface of the upper substrate 200 may be in contact with a top surface of the under-fill layer 400. The under-fill layer 400 may include a central part 401, an edge part 402, and a recess region 410. The central part 401 may be disposed below the upper substrate 200, and may fill a space between the substrate bumps 250. For example, the central part 401 may fill a space between the lower substrate 100 and the upper substrate 200. A description of the central part 401 and the edge part 402 included in the under-fill layer 400 may be substantially the same as that discussed with reference to FIGS. 3 and 4.

In general, when a subsequent annealing process is performed, there may occur a problem wherein the under-fill layer 400 is cracked due to stress generated by a difference in CTE between the lower substrate 100 and an interposer substrate (e.g., the upper substrate 200). According to the present inventive concepts, a laser etching process may form the recess region 410 of the under-fill layer 400, which may reduce the bending stress transferred to the under-fill layer 400 due to an increase in average cross-sectional area of a region where stress is generated. Accordingly, the occurrence of crack on the under-fill layer 400 may be decreased to provide the semiconductor package with increased reliability.

The example embodiments illustrated in of FIGS. 5 and 6 may be substantially the same as that discussed with reference to FIGS. 1 to 4, except that the lower substrate 100 is provided thereon with the upper substrate 200 instead of the semiconductor chip 300, and that the upper substrate 200 is provided thereon with the first semiconductor chip 310 and the second semiconductor chips 320.

Figure 7:
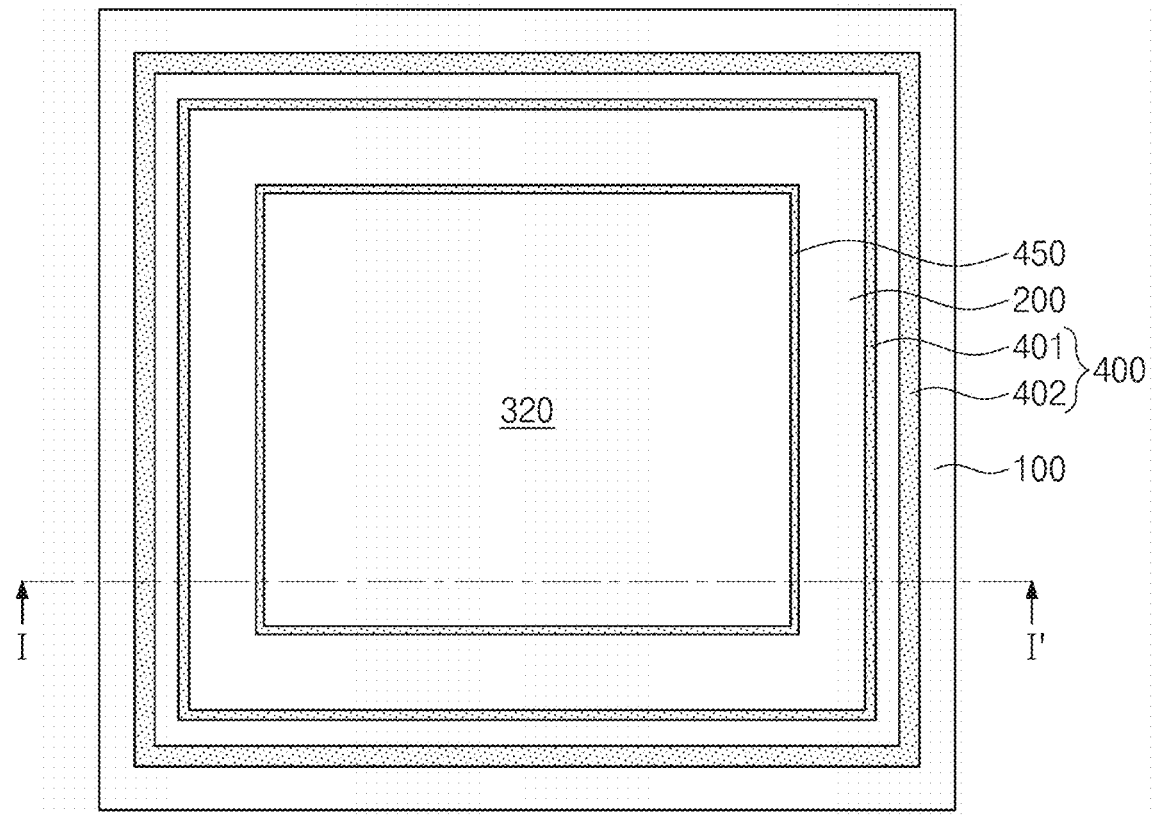
FIG. 7 illustrates a plan view showing a semiconductor package according to some example embodiments of the present inventive concepts.
Figure 8:
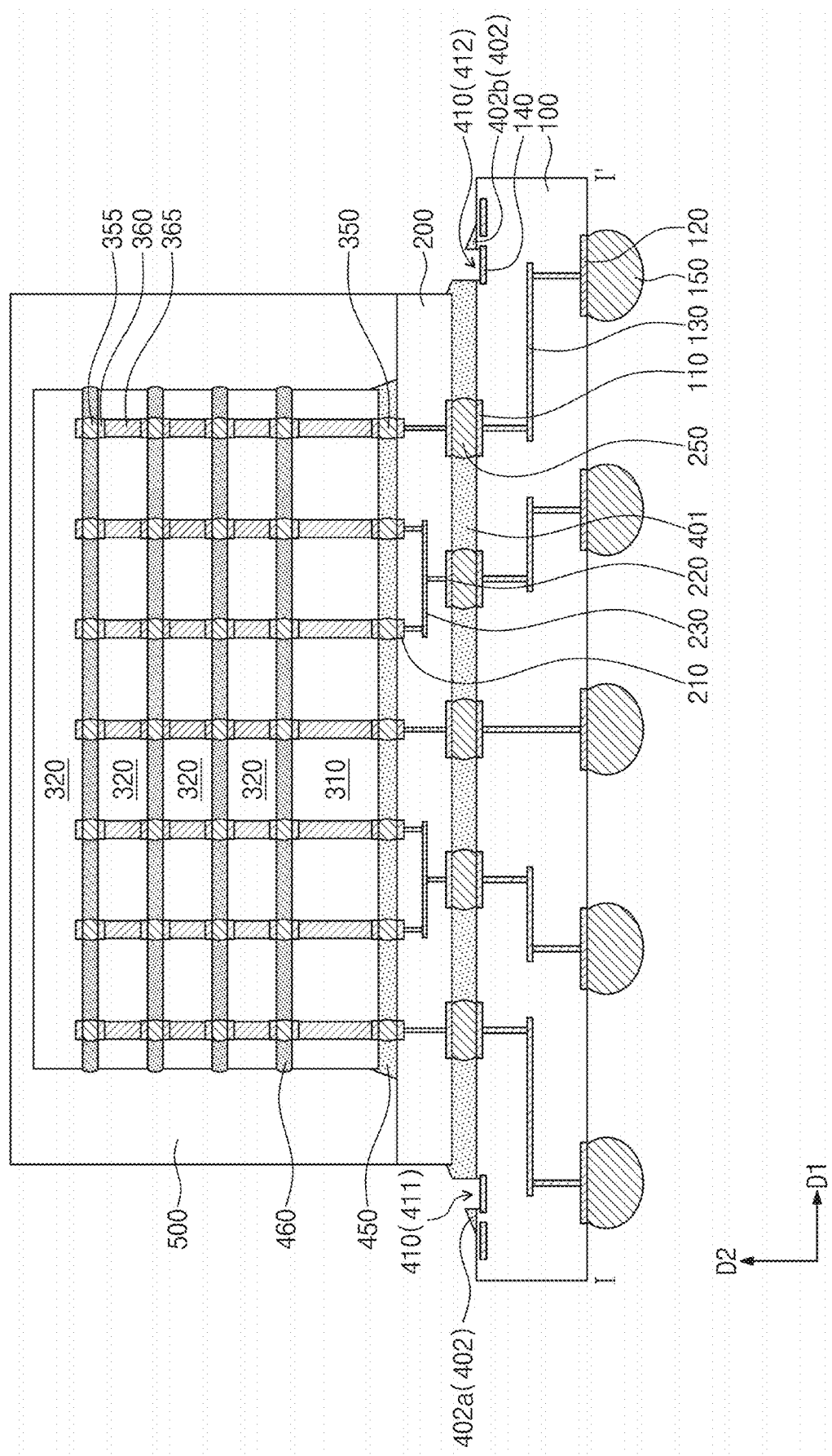
FIG. 8 illustrates a cross-sectional view taken along line I-I' of FIG. 7.

FIG. 7 illustrates a plan view showing a semiconductor package according to some example embodiments of the present inventive concepts. FIG. 8 illustrates a cross-sectional view taken along line I-I' of FIG. 7. Duplicate descriptions will be omitted below. For example, a description of the central part 401, the edge part 402, and the recess region 410 included in the under-fill layer 400 may be substantially the same as that discussed with reference to FIGS. 3 and 4.

Referring to FIGS. 7 and 8 together with FIGS. 3 and 4, the semiconductor package may further include an upper substrate 200, a first semiconductor chip 310 mounted on the upper substrate 200, and second semiconductor chips 320 disposed on the first semiconductor chip 310.

The upper substrate 200 may be disposed on the lower substrate 100. The upper substrate 200 may include first upper substrate pads 210, second upper substrate pads 220, and upper substrate lines 230. The first upper substrate pads 210 may be adjacent to a top surface of the upper substrate 200, and the second upper substrate pads 220 may be adjacent to a bottom surface of the upper substrate 200. The first upper substrate pads 210 may be exposed at the top surface of the upper substrate 200. The second upper substrate pads 220 may be exposed at the bottom surface of the upper substrate 200. The upper substrate lines 230 may be disposed in the upper substrate 200, and may be electrically connected to the first upper substrate pads 210 and the second upper substrate pads 220. The first upper substrate pads 210 and the second upper substrate pads 220 may include a conductive material, for example, at least one metal selected from tin (Sn), lead (Pb), nickel (Ni), gold (Au), silver (Ag), copper (Cu), aluminum (Al), and/or bismuth (Bi). The upper substrate lines 230 may include a conductive material, for example, at least one metal selected from copper (Cu), aluminum (Al), tungsten (W), and/or titanium (Ti).

The lower substrate 100 may be electrically connected, through the substrate bumps 250, to the upper substrate 200. Each of the first upper substrate pads 210 may be electrically connected through a corresponding one of the substrate bumps 250 to a corresponding one of the first lower substrate pads 110. A pitch of the substrate bumps 250 may be less than a pitch of the external terminals 150.

The first semiconductor chip 310 may be mounted on the upper substrate 200. A plurality of second semiconductor chips 320 may be mounted on the first semiconductor chip 310. The second semiconductor chips 320 may be stacked on the first semiconductor chip 310. The first semiconductor chip 310 and/or second semiconductor chips 320 may form chip stacks.

The example embodiments illustrated in FIGS. 7 and 8 may be substantially the same as that discussed with reference to FIGS. 1 to 6, except that the upper substrate 200 is disposed on the lower substrate 100, that the first semiconductor chip 310 is mounted on the upper substrate 200, and that the second semiconductor chips 320 are mounted on the first semiconductor chip 310.

Figure 9:
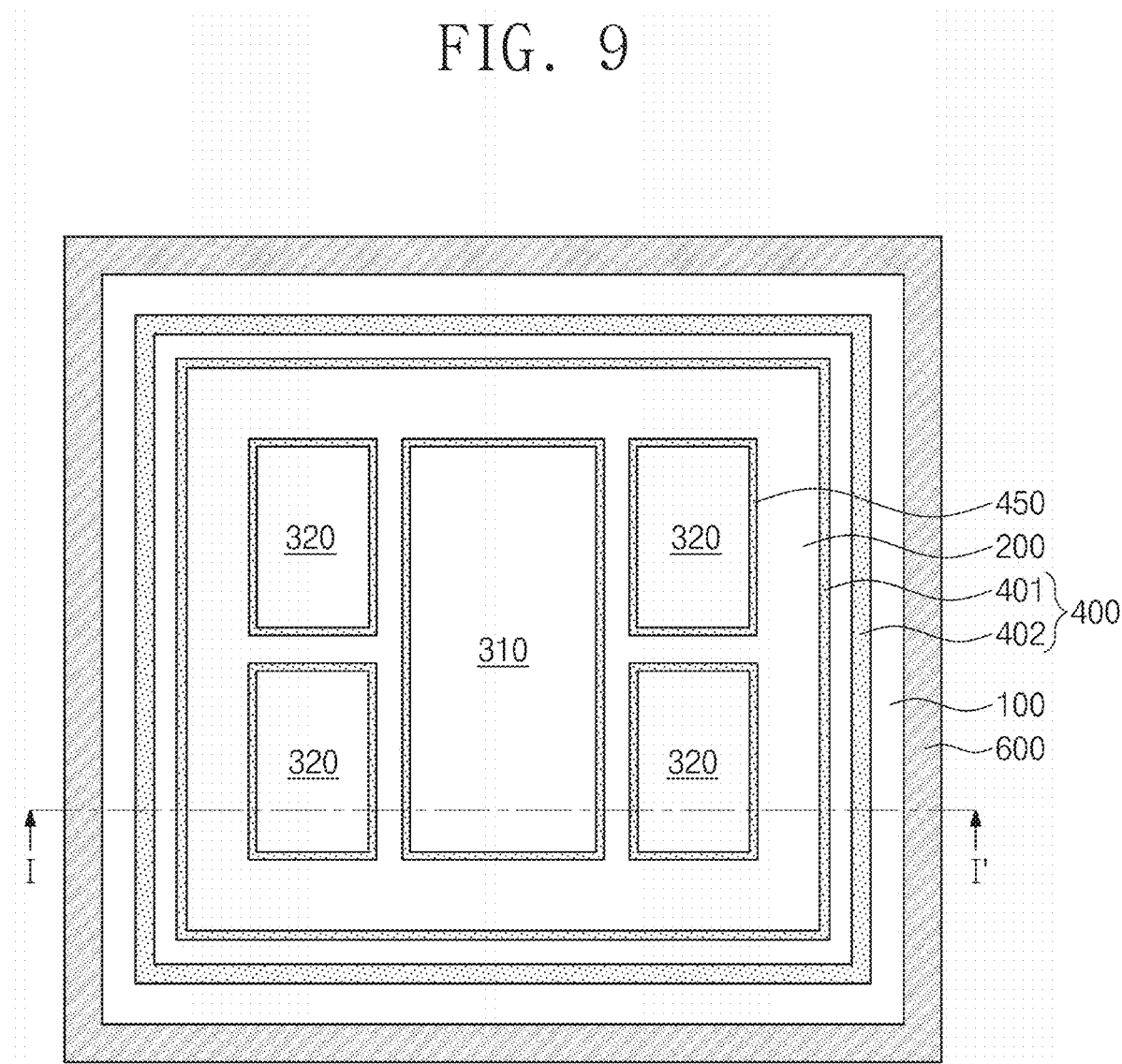
FIG. 9 illustrates a plan view showing a semiconductor package according to some example embodiments of the present inventive concepts.
Figure 10:
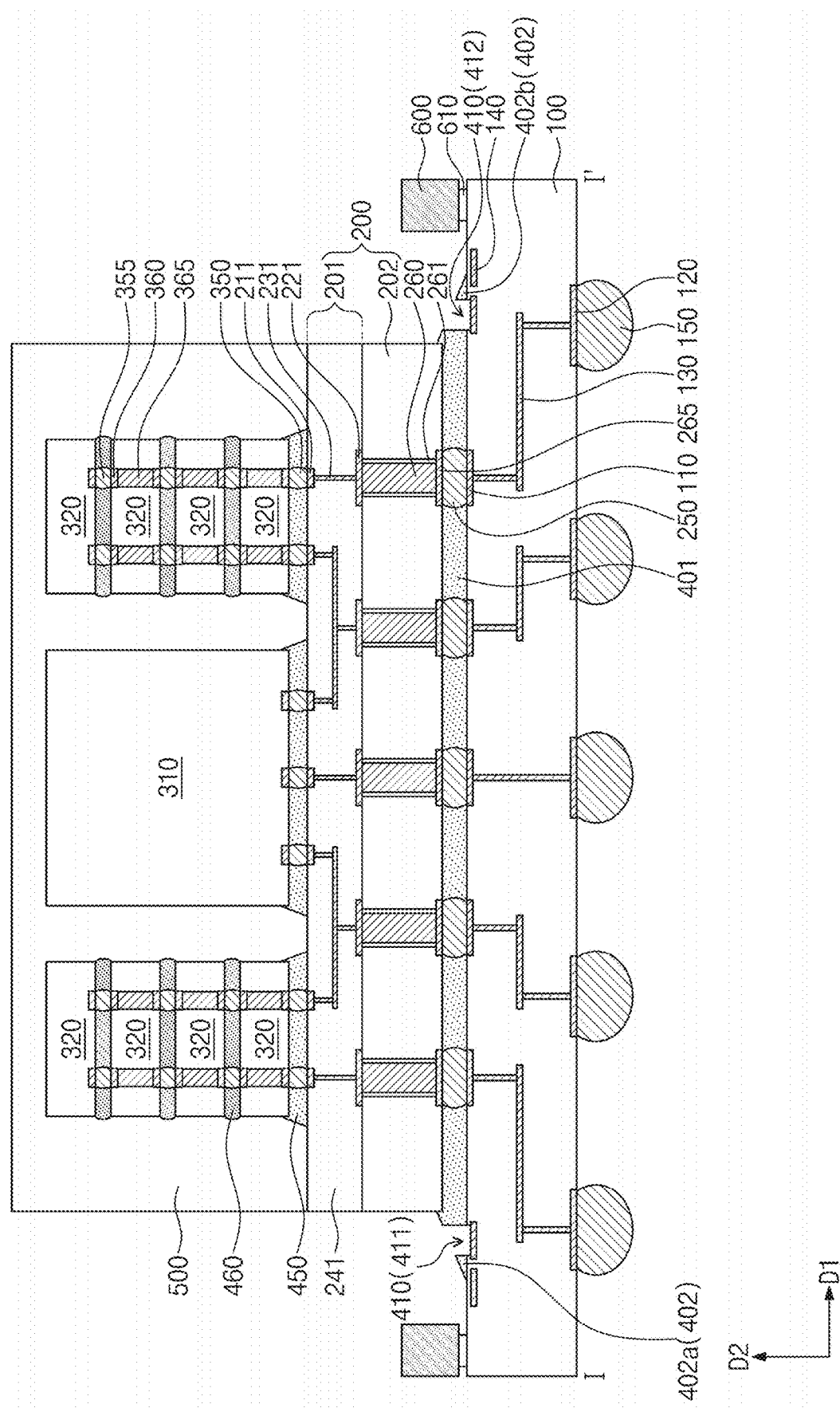
FIG. 10 illustrates a cross-sectional view taken along line I-I' of FIG. 9.

FIG. 9 illustrates a plan view showing a semiconductor package according to some example embodiments of the present inventive concepts. FIG. 10 illustrates a cross-sectional view taken along line I-I' of FIG. 9. Duplicate descriptions discussed above will be omitted below.

Referring to FIGS. 9 and 10, the semiconductor package may further include a stiffener 600 and a connection pattern 610. The stiffener 600 may be disposed adjacent to the first semiconductor chip 310, and may be placed spaced apart in the first direction D1 from the edge part 402 of the under-fill layer 400. For example, the stiffener 600 may encircle the under-fill layer 400 when viewed in the plan view. The stiffener 600 may have a bar shape and a tetragonal cross-section, but the present inventive concepts are not limited thereto. Differently from that shown, the stiffener 600 may not have a single unitary structure, but may have a plurality of structures that are spaced apart from each other. The stiffener 600 may include a conductive material. For example, the stiffener 600 may include at least one selected from palladium (Pd), aluminum (Al), nickel (Ni), titanium (Ti), gold (Au), copper (Cu), and/or platinum (Pt). The stiffener 600 may be connected through the connection pattern 610 to the lower substrate 100. The connection pattern 610 may include a conductive material. The connection pattern 610 may include the same and/or a different conductive material as the stiffener 600. The stiffener 600 may prevent warpage of the lower substrate 100 in subsequent processes.

The example embodiments, as illustrated in FIGS. 9 and 10 may be substantially the same as that discussed with reference to FIGS. 5 and 6, except that the stiffener 600 and the connection pattern 610 are further included. Furthermore, though not shown, the stiffener 600 and the connection pattern 610 may be included in the embodiments illustrated in FIGS. 1 and 2, and FIGS. 7 and 8.

Figure 11:
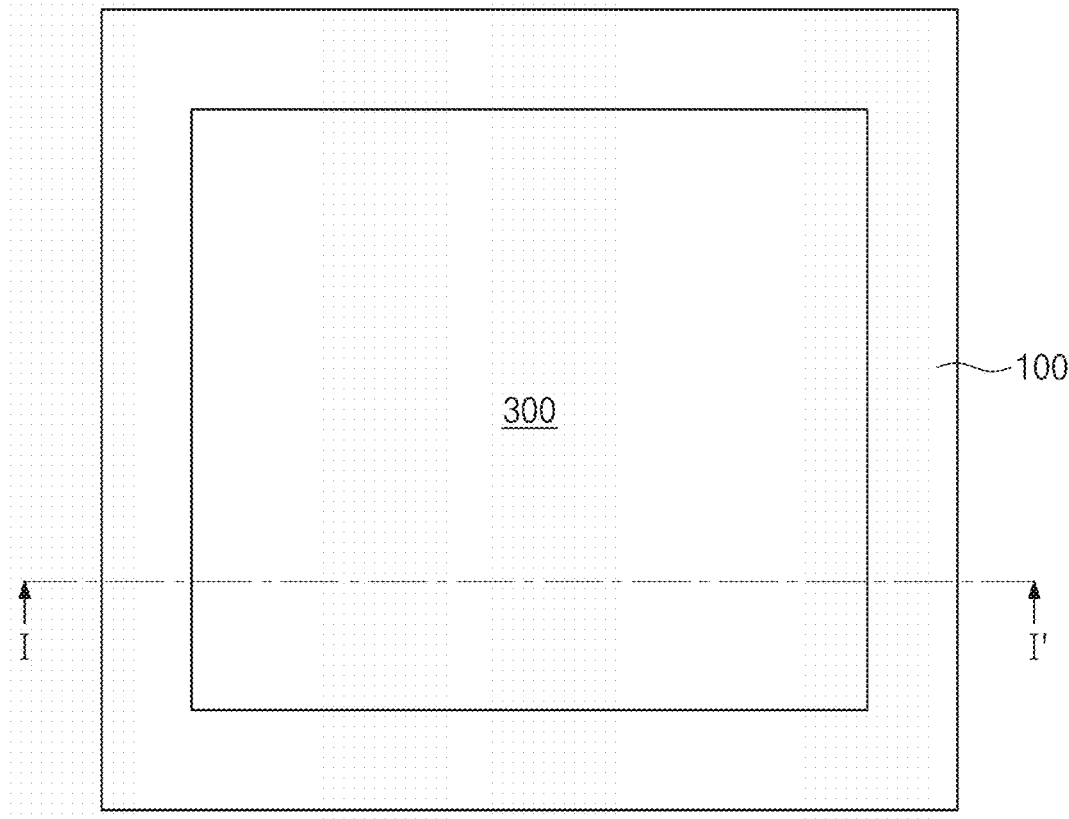
FIGS. 11 and 13 illustrate plan views showing a method of fabricating a semiconductor package according to some example embodiments of the present inventive concepts.
Figure 12:
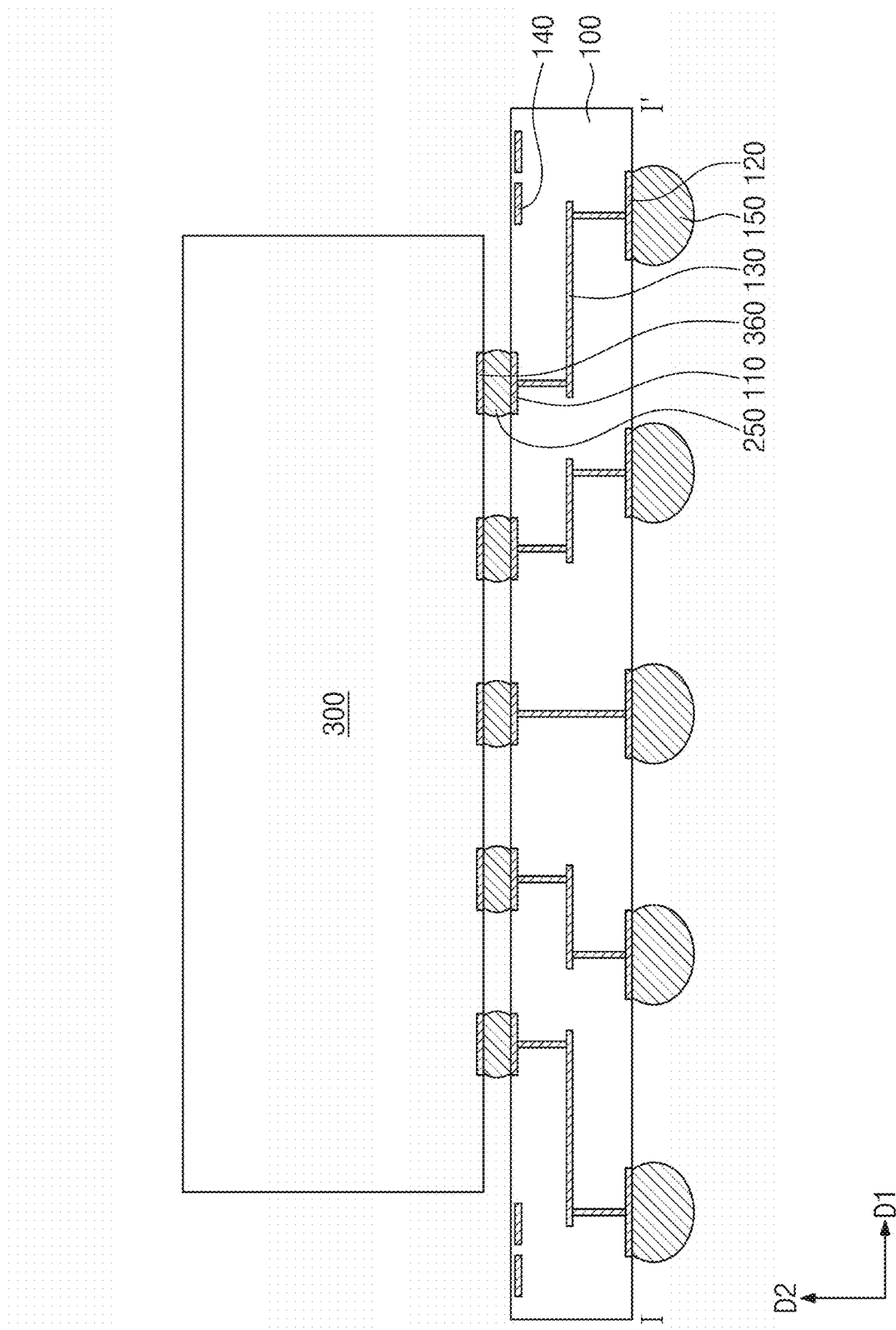
Figure 13:
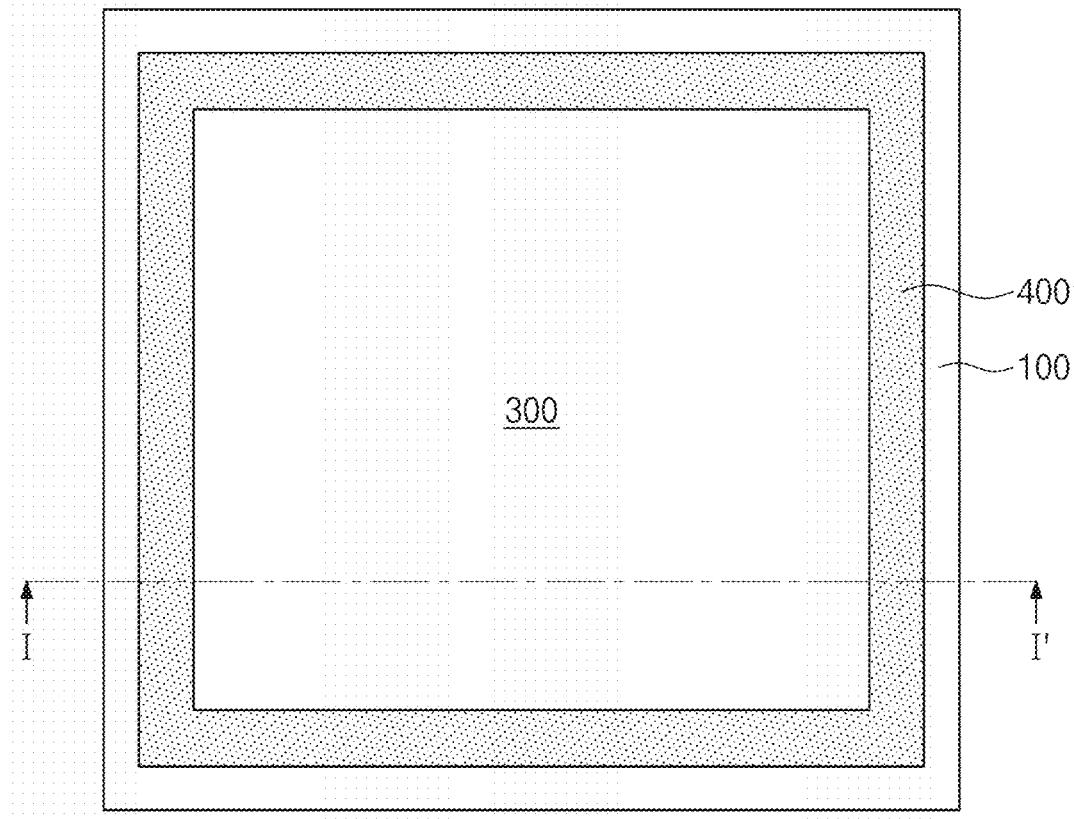

FIGS. 11, 13, and 1 illustrate plan views showing a method of fabricating a semiconductor package according to some example embodiments of the present inventive concepts. FIGS. 12, 14, and 2 illustrate cross-sectional views showing a method of fabricating a semiconductor package according to some example embodiments of the present inventive concepts.

Referring to FIGS. 11 and 12, a lower substrate 100 may be provided. Second lower substrate pads 120 and external terminals 150 may be provided on a bottom surface of the lower substrate 100. First lower substrate pads 110 may be provided on a top surface of the lower substrate 100. Lower substrate lines 130 and a conductive line 140 may be provided in the lower substrate 100. Substrate bumps 250 may be provided on corresponding ones of the first lower substrate pads 110 on the lower substrate 100. A semiconductor chip 300 may be mounted on the lower substrate 100. The mounting of the semiconductor chip 300 may include coupling the substrate bumps 250 to chip pads 360 on a bottom surface of the semiconductor chip 300.

Referring to FIGS. 13 and 14, an under-fill layer 400 may be formed between the lower substrate 100 and the semiconductor chip 300. The formation of the under-fill layer 400 may include sealing the substrate bumps 250 by filling a space between the lower substrate 100 and the semiconductor chip 300.

Referring back to FIGS. 1 and 2, a recess region 410 may be formed on the under-fill layer 400 formed on one side of the semiconductor chip 300. The formation of the recess region 410 may include performing a laser etching process on the under-fill layer 400. The formation of the recess region 410 may include forming a central part 401 below the semiconductor chip 300 which fills a space between the substrate bumps 250, and also forming an edge part 402 spaced apart in a first direction D1 from the central part 401, wherein first direction D1 is parallel to the top surface of the lower substrate 100. The laser etching process may expose one sidewall of the central part 401, one sidewall of the edge part 402, and a top surface 141 of a portion of the conductive line 140 in the lower substrate 100. A description of the central part 401, the edge part 402, and the recess region 410 included in the under-fill layer 400 may be substantially the same as that discussed with reference to FIGS. 3 and 4.

In semiconductor packages according to some example embodiments of the present inventive concepts, a laser etching process may form an under-fill layer having a recess region such that a central part of the under-fill layer may have an increased height. As a result, bending stress may be reduced due to an increase in average cross-sectional area of a region where stress is generated. Accordingly, the occurrence of crack on the under-fill layer may be decreased to provide the semiconductor package with increased reliability.

Although the present inventive concepts have been described in connection with the some example embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor package, comprising:
    a lower substrate including a conductive line;
    a first semiconductor chip on the lower substrate;
    an under-fill layer between the first semiconductor chip and the lower substrate, the under-fill layer including
        a central part below the first semiconductor chip, the central part including an inner sidewall adjacent to a sidewall of the first semiconductor chip and an outer sidewall spaced apart from inner sidewall in a first direction parallel to a top surface of the lower substrate, and
        an edge part spaced apart from the central part in the first direction parallel to the top surface of the lower substrate; and
    a recess region between the central part and the edge part, the recess region including a first sidewall defined by the outer sidewall of the central part, a second sidewall defined by a sidewall of the edge part, and a bottom surface defined by a portion of a top surface of the conductive line,
    wherein a length, in a second direction parallel to the top surface of the lower substrate, of at least one of the first or second sidewalls of the recess region is greater than a width of the recess region in the first direction.

2. The semiconductor package of claim 1, wherein
    the central part of the under-fill layer fills a space between the lower substrate and the first semiconductor chip, and
    the recess region of the under-fill layer is adjacent to a side of the first semiconductor chip.

3. The semiconductor package of claim 1, wherein the width in the first direction of the recess region is less than a width in the first direction of the conductive line.

4. The semiconductor package of claim 1, wherein the width in the first direction of the recess region is in a range of 10 μm to 500 μm.

5. The semiconductor package of claim 1, wherein a height of the outer sidewall of the central part is greater than a height of the sidewall of the edge part.

6. The semiconductor package of claim 1, wherein a minimum width in the first direction between the outer sidewall of the central part and a sidewall of the first semiconductor chip is in a range of 120 μm to 500 μm.

7. The semiconductor package of claim 1, wherein
    the outer sidewall of the central part is a first outer sidewall of the central part,
    the edge part includes a first edge part adjacent to the first sidewall of the central part and a second edge part isolated from direct contact with a second outer sidewall of the central part in the first direction, and
    the recess region includes a first recess region defined by the first outer sidewall of the central part and a third sidewall of the first edge part and a second recess region defined by the second outer sidewall of the central part and a fourth sidewall of the second edge part.

8. The semiconductor package of claim 7, wherein each of the first and second recess regions exposes a corresponding top surface of the conductive line.

9. The semiconductor package of claim 1, wherein the first semiconductor chip includes an interposer substrate between the lower substrate and the first semiconductor chip,
    wherein a bottom surface of the interposer substrate is in contact with a top surface of the under-fill layer and the inner sidewall of the central part.

10. The semiconductor package of claim 9, further comprising:
    a plurality of second semiconductor chips on the top surface of the interposer substrate,
    wherein the plurality of second semiconductor chips are of a different type from the first semiconductor chip.

11. The semiconductor package of claim 10, further comprising:
    a plurality of bumps between the lower substrate and the interposer substrate, the bumps electrically connecting the lower substrate to the interposer substrate; and
    an additional under-fill layer between the interposer substrate and the first semiconductor chip and between the interposer substrate and a lowermost one of the plurality of second semiconductor chips.

12. The semiconductor package of claim 10, further comprising:
    a molding layer on the interposer substrate, the molding layer covering the first semiconductor chip and the second semiconductor chips.

13. The semiconductor package of claim 9, further comprising:
    a chip stack on the first semiconductor chip, wherein the chip stack includes a plurality of stacked second semiconductor chips,
wherein the plurality of stacked second semiconductor chips are of a different type from the first semiconductor chip.

14. The semiconductor package of claim 1, further comprising:
a stiffener on the lower substrate and adjacent to a side of the first semiconductor chip,
wherein the stiffener is isolated from direct contact, in the first direction, with the edge part of the under-fill layer.

15. A semiconductor package, comprising:
a lower substrate including a conductive line;
a first semiconductor chip on the lower substrate;
an under-fill layer between the first semiconductor chip and the lower substrate, the under-fill layer including
a central part below the first semiconductor chip, the central part including an inner sidewall adjacent to a sidewall of the first semiconductor chip and an outer sidewall spaced apart from inner sidewall in a first direction parallel to a top surface of the lower substrate, and
an edge part isolated from direct contact with the central part in the first direction parallel to the top surface of the lower substrate; and
a recess region between the central part and the edge part, the recess region including a first sidewall defined by the outer sidewall of the central part, a second sidewall defined by a sidewall of the edge part, and a bottom surface defined by a portion of a top surface of the conductive line,
wherein a bottom surface of the recess region is lower than the top surface of the lower substrate, and
wherein a length of a sidewall of the recess region is greater than a width between the central part and the edge part.

16. The semiconductor package of claim 15, wherein the recess region exposes a portion of a top surface of the conductive line.

17. The semiconductor package of claim 15, further comprising:
an interposer substrate between the lower substrate and the first semiconductor chip; and
a chip stack, including a plurality of stacked second semiconductor chips, on a top surface of the interposer substrate, the chip stack isolated from direct contact, in the first direction, with the first semiconductor chip,
wherein the under-fill layer is between the interposer substrate and the lower substrate,
the first semiconductor chip is on the top surface of the interposer substrate, and the plurality of stacked second semiconductor chips are of a different type from the first semiconductor chip.

18. A semiconductor package, comprising:
a lower substrate including a conductive line;
an interposer substrate on the lower substrate and electrically connected to the lower substrate through a plurality of bumps;
a first semiconductor chip on the interposer substrate;
a plurality of chip stacks on the interposer substrate and isolated from direct contact with each other in a first direction parallel to a top surface of the lower substrate, wherein the first semiconductor chip is disposed between the plurality of chip stacks;
an under-fill layer between the lower substrate and the interposer substrate, the under-fill layer including
a central part below the interposer substrate, and
an edge part isolated from direct contact, in the first direction, with the central part; and
a recess region between the central part and the edge part, the recess region including a first sidewall defined by a sidewall of the central part, a second sidewall defined by a sidewall of the edge part, and a bottom surface defined a portion of a top surface of the conductive line in the lower substrate,
wherein a length, in a second direction parallel to the top surface of the lower substrate, of at least one of the first or second sidewalls of the recess region is greater than a width of the recess region in the first direction.

19. The semiconductor package of claim 18, wherein a height of the sidewall of the central part is 60% to 88% of a maximum height of the central part.

20. The semiconductor package of claim 18, wherein each of the plurality of chip stacks includes a plurality of stacked second semiconductor chips, and
the plurality of stacked second semiconductor chips are of a different type from the first semiconductor chip.

* * * * *